United States Patent [19]

Bellott, Jr.

[11] 4,454,200
[45] Jun. 12, 1984

[54] METHODS FOR CONDUCTING ELECTRON BEAM LITHOGRAPHY

[75] Inventor: Emile M. Bellott, Jr., Beverly, Mass.

[73] Assignee: Varian Associates, Inc., Palo Alto, Calif.

[21] Appl. No.: 471,577

[22] Filed: Mar. 3, 1983

[51] Int. Cl.³ .............................. B32B 9/04; G03C 5/00
[52] U.S. Cl. .................................. 428/411.1; 430/269; 430/323; 430/331
[58] Field of Search ............... 430/269, 323, 331, 288, 430/18, 296, 347; 428/411; 427/271, 273, 307

[56] References Cited

PUBLICATIONS

Thompson, L. F., *Solid State Technology*, Jul. 1974, Part 1, pp. 27–30, and 40; Aug. 1974, Part 2, pp. 41–46.
Imamura, S., *J. Electrochem. Soc.*, Sep. 1979, pp. 1628–1630.
Thompson et al., *J. Electrochem. Soc.*, Oct. 1979, pp. 1699–1702, 1703–1708.
Brault et al., "A Method for Rapidly Screening Polymers as Electron-Beam Resists", *Proceedings on the Symposium on Electron and Ion Beam Science and Technology*, 9th Int. Conf., edited by Bakish, 1980.
Watts et al., "Solubility Ratio, Sensitivity and Line Profile Control in Positive E-Beam Resists", *Proceedings on the Symposium on Electron Beam Science and Technology*, 9th Int. Conf., edited by Bakish, 1980.
Martel et al., reprint from *Semiconductor International*, Jan.–Feb. 1979, pp. 1–8.
Thompson et al., *Annual Reviews of Material Sciences*, vol. 6, 1976, pp. 267–301.
Hatzakis, M., *J. Vac. Sci. Technol.*, vol. 12, No. 6, Nov./Dec. 1975, pp. 1276–1279.
Feit et al., *J. Vac. Sci. Technol.*, vol. 16, No. 6, Nov./Dec. 1979, pp. 1997–2002.
"Reilly Introduces Pyridine Functionality In Polymer Form"; *Reilly Pyridines*, 4th Edition, Reilly Tar & Chemical Corporation; Indianapolis, Indiana (1979).

*Primary Examiner*—Thomas J. Herbert, Jr.
*Attorney, Agent, or Firm*—Stanley Z. Cole; William R. McClellan

[57] ABSTRACT

Plasma etch durability of polymeric resists used in electron beam lithography is improved by vapor phase impregnation with an aromatic compound after development of an image. The aromatic compound should possess a polarity similar to the polymeric resist and should be relatively volatile to facilitate vapor phase diffusion.

19 Claims, 1 Drawing Figure

THICKNESS OF RESIST IMAGES vs MOIST AIR PLASMA EXPOSURE

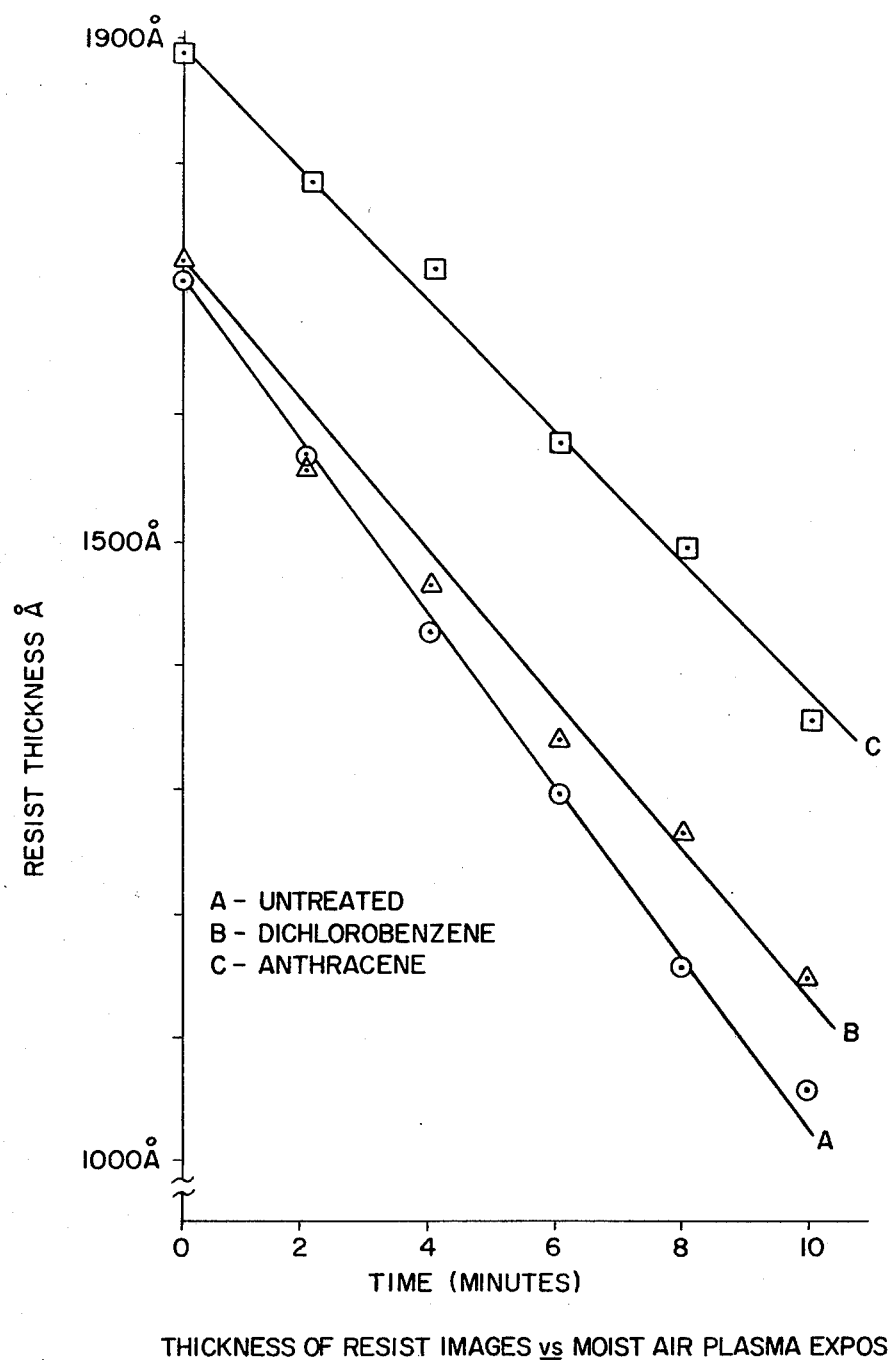
THICKNESS OF RESIST IMAGES vs MOIST AIR PLASMA EXPOSURE

METHODS FOR CONDUCTING ELECTRON BEAM LITHOGRAPHY

FIELD OF THE INVENTION

This invention relates to electron beam lithography and more particularly to methods for the improvement of plasma etch durability of polymeric resist materials in submicron direct lithography.

BACKGROUND OF THE INVENTION

In electron beam lithography, a polymeric film which is sensitive to light, generally termed a resist, is applied to a support substrate. The film is then exposed to radiation which defines a pattern desired to be reproduced on the support. Exposure of the resist results in a different solubility between the exposed and unexposed portions so that a solvent can be used to remove the more soluble portion of the resist and a surface relief pattern can be obtained. Thereafter by using suitable etching techniques desired features can be produced on or in the substrate. As described for example in various publications and U.S. Pat. No. 4,262,083, an electron beam can be used to delineate circuits with greater resolution than that which can be obtained with light in prior art photo lithographic processes. The higher resolution of the electron beam is due in part to the fact that an electron beam can be more precisely focused than can a light beam. The electron beam has been proven commercially and continues to be a viable and important tool for the manufacture of microelectronic circuits and masks for forming printed circuits by other methods.

An important factor which has inhibited the full utilization of electron beam and X-ray lithography to date in the manufacture of electronic circuits are limitations on the resists which are used in the process.

Various polymeric compositions have been suggested as candidates for resists. Commercially available electron beam resist polymeric compositions include polystyrene, polymethyl methacrylate, polyglycidyl methacrylate and polychloromethylstyrene. Other polymers which may be used include poly(diallylphthalate), poly(methylvinyl ketone), poly(vinylacetate), poly(vinyl cinnamate), poly(vinyl chloride), polyvinyl pyrrolidone, poly(glycidyl methacrylate-co-ethyl acrylate), poly(4-chlorostyrene), polyvinyltoluene (mixed isomers), polyvinylbenzylchlorides, poly (4-bromostyrene), poly(4-iso-propylstyrene), poly(4-tert.-butylstyrene), poly(butene-1-sulfone), copolymers of alpha cyano ethyl acrylate and alpha amide ethyl acrylate, poly(glydidyl acrylate), poly (glycidyl methacrylate-co-3-Chlorostyrene), as well as similar polymers.

The advantage in using electron resists composed of high molecular weight polymers is that the polymers generally undergo cross linking or chain scission as a result of the action of the high energy electrons on the polymer chain itself or on the radiation sensitive chemical moieties attached to the polymer chain. The glycidyl methacrylate family of resists are typical of this latter type of material. In compounds of this type the radiation-labile epoxy moiety is readily converted into a cross linkable radical type and species by the action of the electrons. In general, any polymeric material useful as a negative resist cross-links and becomes insoluble on exposure to electrons.

When an electron beam enters a thin polymer film, the incident electrons lose energy as they undergo inelastic collisions with the polymer molecules. Electrons used in electron beam lithography, typically on the order of 5–20 keV, have energy several orders of magnitude in excess of that associated with chemical bonds. The electron-chemical bond interaction is relatively non-specific and not strictly analogous to the well characterized reactions of molecular photochemistry. For this reason most of the investigators have been hesitant to discuss resist action in terms of specific chemical reaction mechanisms. Notwithstanding the chemical nature of electron interaction with polymers, the initially formed reactive species do follow the generally well known rules of chemical reactivity. This means that the nature of the reactive intermediates can lead to suggested improvements in resist properties by chemical tailoring.

Resist materials for use in electron beam lithography must possess a number of characteristics. Thus, they must be soluble in a solvent so that they can be applied as a thin film on the supporting substrate and must have sufficient adhesion to form a tight bond with the substrate. Further, as a result of exposure to the selected type of radiation, a substantial change in the solubility of the exposed and unexposed portions must occur so that one of the portions will become soluble in a selective solvent and can be removed to provide the desired surface relief pattern. Depending on whether or not the resist is a negative resist or a positive resist will determine whether or not the resulting soluble portion is the exposed or unexposed area.

The resist materials, in addition to having the above characteristics, must also have the required degree of sensitivity, resolution and contrast to define submicron patterns required by the process. These particular characteristics are in addition to those essential requirements that they provide resists free from defects, be uniform, be easy to process, be resistant to degradation by the etchant, and subsequently easy to remove. In general, however, most of the previously known commercial resist materials fall short in one or more of the criteria deemed necessary for compatibility with electron-beam lithography.

Most of these previously described resist materials suffer from the lack of sensitivity, the lack of resolution, or the lack of resistance to plasma etching. For example, poly(butene-1-sulfone), or PBS, resist is sensitive, has high resolution, but does not withstand a plasma etching. However, a poly(glycidyl methacrylate-co-ethyl acrylate), resist is sensitive, withstands plasma etching moderately, but has relatively lower resolution. Poly(-methyl methacrylate) and polystyrene have high resolution and great ability to withstand plasma etching but are very insensitive. One simple expedient which would improve the plasma etch durability of a resist image is to use a thicker initial resist coating on the substrate. Unfortunately, however, ultimate resolution is then worse when a thicker coating is used and there are increased problems with resist image swelling.

An alternative approach to this problem is to chemically modify the polymer materials used as resists according to known relationships between structure and properties to improve sensitivity or improve plasma etch durability. Thus, it is known that the sensitivity of polystyrene is improved by the incorporation of chloromethyl moieties as shown by Imamura, J. Electrochem. Soc., 126, 1628 (1979), and Choong et al, 16th Symposium on Electron Ion and Photon Beam Technology, Dallas, Texas, May 26–29, 1981. Also, the resist (2,2,2- trifluoroethyl-alpha-chloroacrylate), has greater sensitivity than PMMA and improved etch resistance under exposure to moist air plasma as shown in product literature under the tradename EBR-9 by Toray Inc., Tokyo, 1981.

Moreover it is known that a resist material may be compared to any polymeric organic coating and its physical and chemical properties can be modified by following well-established procedures used extensively by the coatings industry. For example, thermal and radiation stability can be improved by incorporating aromatic moieties into the polymer. Polystyrene has been used by workers of Texas Instruments as a negative e-beam resist in the fabrication of microwave bipolartransistors. Sensitivity is worse than $10^{-5}c/cm^2$ but polystyrene exhibits a high contrast and serves as a tenacious etching mask. Plasma etch durability is reported to be excellent, see Thompson, Solid State Technology, page 27, July 1974. Polyglycidyl methacrylate (PGMA) is also known to be a sensitive resist with only fair plasma etch durability. It has been found that glycidyl methacrylate monomer can copolymerize with styrene to create a resist with improved sensitivity over polystyrene, while incorporating much of polystyrene's plasma etch durability, see Thompson et al., J. Electrochem. Soc., 126, page 1699 (1979). Also it is known that glycidyl methacrylate may be copolymerized with chlorostyrene to result in a modified resist.

While incorporation of aromatic chemical moieties in a polymeric material has been demonstrated to improve plasma etch durability the more durable resists are not as sensitive as the current commercially available e-beam resists. The present invention solves the problem in the art of providing a process wherein the plasma etch durability of resist images delineated in the current generation of commercially available electron beam sensitive resist compounds can be substantially improved.

SUMMARY OF THE INVENTION

It is accordingly one object of this invention to provide methods for conducting electron beam lithography wherein the plasma etch durability of the resist is improved.

A further object of the present invention is to provide methods for diminishing the resist removal rate in plasma in methods for conducting electron beam lithography.

A still further object of the present invention is to provide methods for improving the plasma etch durability of polymeric resist materials used in electron beam lithography by treatment of the resist material by vapor phase impregnation after development of an image.

Other objects and advantages of the present invention will become apparent as the description thereof proceeds.

In satisfaction of the foregoing objects and advantages there is provided a method for improving the plasma etch durability of polymeric resist materials and images delineated in said resist materials, which comprises incorporating an aromatic chemical compound into the resist image by vapor phase diffusion after exposure and development. Also included in the invention is an article of manufacture comprising a substrate having a polymeric resist thereon, said polymeric resist material having been impregnated with a volatile aromatic chemical compound by vapor diffusion.

The present invention also provides a method for forming a predetermined surface relief pattern in a film of a resist material, the method comprising the steps of:
(a) providing a layer of a polymeric resist material on a substrate;
(b) exposing a portion of the film corresponding to said predetermined pattern to radiation which changes the solubility of one portion of the film with respect to the other portion of the film;
(c) dissolving the more soluble portion of the film with a developer solution to provide a relief pattern; and
(d) subjecting said remaining portion of the film to vapor phase impregnation with a volatile aromatic chemical compound to decrease the resist removal rate of said unexposed portion in plasma.

BRIEF DESCRIPTION OF THE DRAWING

Reference is now made to the drawing accompanying this application which is a graph showing the resist thickness obtained in an untreated resist and in a resist treated by vapor phase impregnation with organic compounds according to the present invention.

DESCRIPTION OF PREFERRED EMBODIMENTS

The present invention is concerned with electron beam lithography and more particularly with an improved method for conducting electron beam lithography. As pointed out above, there have previously been employed in electron beam lithography electron resists comprising polymeric materials whose solubility is increased or decreased by exposure to a beam of electrons. When properly processed, the polymeric material will form a pattern to be used as a mask during selective etching of the thin dielectric and conductor films used in device fabrication. Electron beam lithography is presently used in the production of solid-state electronic devices or computer chips which consist of patterned thin films of one or more metals, dielectrics and semiconductors on a monolithic substrate, usually a silicon or sapphire wafer as large as 125 mm in diameter. An individual chip may vary from about 4 to 15 mm on a side and may contain as many as 250,000 discrete components, usually transistors.

The fabrication of these devices depends on controlled deposition and removal of the various thin film and substrate materials. The process called "microlithography" is used in such processes to produce the desired patterns in the solid-state device. Micro-lithography may be defined as a temporary stencil like pattern in a thin film covering the device surface using techniques related to photography followed by selective etching, or in some cases deposition in unprotected areas. The temporary film known as a resist material is then removed and processing continues.

Resist materials used for microelectronics depend on radiation induced changes and the solubility of a synthetic organic polymer in a selected developer solvent. Resist materials are classified as either positive working or negative working depending on whether solubility in the developer increases (positive) or decreases (negative) upon exposure to irradiation. Polymers are universally used for preparing resist because of their excellent film forming and coating properties and the ease with which synthetic techniques can influence such properties. To act as a resist the polymer must absorb the radiation used to expose it and must contain, either as components of its molecular composition, or as a second constituent mixed with it, species that react chemically in carefully selected ways when excited by the absorbed radiant energy. These reactions therefore bring about the desired changes in solubility.

As indicated above, a particularly advantageous method of producing these electronic devices is by use of electron beam technology or X-ray resist. These systems have the ability to focus electron beams to very small diameters, below 1,000 Å, and very short wavelengths of soft X-rays, 5 to 50 Å. The pattern resolution obtainable with resists exposed to such radiation no longer depends primarily on the means of exposure. The fundamental limitations on resolution are a function of the scattering of electrons or in the case of X-rays, the range of the photoelectrons produced on absorption of the radiation in the resist material for the scattering of electrons reflected from the substrate. The electron beam techniques employ a scanned, sharply focused beam as a pencil to delineate the desired patterns while the X-ray scheme uses flood exposure through a patterned mask. In both cases the interaction of energetic electrons with the resist material brings about the solubility altering chemical reactions.

A large number of organic polymeric materials have been used as resists in such processes. In many of these previously used polymeric resists, a common problem is etch resistance. The resist must withstand the etching process in order to be a successful resist material. In accordance with modern techniques, in which plasm etching is commonly used, the resist must withstand dry etching techniques of the type used in plasma etching. This characteristic is usually referred to as plasma etch durability.

The present invention provides a method whereby electron beam lithography can be conducted with improved plasma etch durability of the resist material. Thus, according to the present invention it has been found that the plasma etch durability of a resist material can be enhanced by vapor phase impregnation of the polymer matrix with one or more volatile aromatic chemical compounds. This treatment of the resist material by vapor phase impregnation is carried out after development of an image in conducting the process. It has been found that vapor phase impregnation using the compounds of the present invention can effect substantial improvements in the resist removal rate from moist air plasma. An important advantage of the present invention is that the resist image can be defined using a relatively sensitive resist material while taking advantage of the resolution and sensitivity of off-the-shelf commercial materials which may have poor plasma etch durability. These materials can be used in the method of the present invention whereby after delineation of the resist image, improved plasma etch durability can be imparted by vapor phase impregnation of the polymer matrix with a volatile aromatic chemical compound.

The vapor phase treatment of the polymer matrix, which is the polymeric resist, with an aromatic hydrocarbon, referred to herein as a guest compound, in accordance with this invention involves the formation of a solution in which the polymeric matrix will be the solvent with the aromatic hydrocarbon being introduced as the solute. The resultant reaction product will be a homogeneous thermodynamically stable system in which durability to plasma etching is substantially improved.

Several factors affect the ability of polymers to form homogeneous thermodynamically stable systems including the chemical nature of the polymer and the molecules to be introduced into the polymer, the flexibility of the polymer chain, the molecular weight of the polymer and the chemical cross-linking between chains of the polymer. Thus, the dissolution of the aromatic hydrocarbon by vapor deposition in an amorphous linear polymer depends primarily on relative polarities. If the chain units are close in polarity to the aromatic compound or guest compound, the interaction between like and unlike molecules permits dissolution to occur. If the polymer chain units and solute differ greatly in polarity, effective dissolution will not occur. Polymers composed of an ethylenic chain with attached hydrocarbon esters will be expected to dissolve moderately polar or polarizable molecules in preference to highly polar or very non-polar compounds.

The mechanism of dissolution of the guest molecule consists of separation of the polymer chains from one another and the diffusion of the solute into the polymer matrix. Energy is not spent separating two chains over their entire length simultaneously. The small amount of energy required to offset the chain to chain Van der Waal's interaction is provided by the local chain-solute interaction. Moreover, the greater the molecular weight of the polymer the higher the energy of interaction between the chains. Hence, the dissolution of a guest molecule in a polymer matrix will be favored by a lower polymer molecular weight. Further, a moderate number of chemical cross-links between polymer chains will prevent their facile separation to accomodate guest solute molecules. Thus, the cross-linking of a negative resist material to form a lithography useful image diminishes the amount of guest solute compound that can be diffused into the polymer matrix thus placing an upper limit on the effectiveness of diffusing any plasma etch durable chemical compound.

Based on these considerations, the chemical compound used to improve or impart plasma etch durability to a resist image according to this invention should possess a polarity similar to that of the host polymer compound, should be of a chemical type compatible with the host polymer, should be relatively volatile so as to facilitate vapor phase diffusion, should be aromatic in order to improve plasma etch durability and should be readily available in pure form. The high molecular weight of polymeric resists and the cross-linking required to effect an image in negative resists preferably define the types of compounds which can be incorporated into the polymeric matrix.

Aromatic compounds which meet this definition include those of the following general formula:

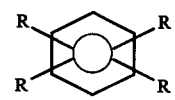

wherein any of the R groups can be hydrogen, halogen, alkyl of 1 to 7 carbons, alkoxy, phenyl or any two or more of the R groups can be alkylene chains of 3 to 4 carbon atoms to form one or more fused rings on the basic benzene nucleus. Preferred aromatic compounds within this general formula include benzene, naphthalene, anthracene, biphenyl, and 1,4-dichlorobenzene.

Anthracene and 1,4-dichlorobenzene are especially preferred materials.

Polymeric compositions preferably used as the resist in accordance with the present invention include polystyrene, polymethylmethacrylate, polyglycidylmethacrylate, copolymers of polyglycidylmethacrylate and ethylacrylate, polybutene sulfone, and the like including those listed hereinabove. An especially suitable commercial material is a polymer derived from an oxirane and sold under the trademark SEL-N-B, by Somar Manufacturing Co. Ltd., of Tokyo, Japan. This material is described in U.S. Pat. No. 4,299,911 to Ochi.

In practicing the novel step of the present invention to increase plasma etch durability, the resist images which have been produced from the polymeric compound, are treated at a temperature ranging from about 100° to about 200° C. for about one-half to three hours in the presence of a vapor of the selected guest aromatic compound or compound to be introduced into the polymeric matrix. Preferred conditions include treatment of the resist for approximately three-quarters to one and one-half hours at 125° to 175° C. It should be noted that while the above conditions are set forth for the specific compounds of the invention in the vapor treatment process, that temperature ranges and time periods outside those set forth may be necessary for guest compounds which vaporize at higher or lower temperatures than those set forth.

A further feature of the present invention is that treatment of the resist is carried out after development of the image, as the preferred embodiment of the invention. Thus, in the conduct of the micro-lithography process, full advantage can be taken of the intrinsic high sensitivity and resolution of a given resist which does not necessarily embody good plasma etch durability. Vapor phase treatment of the resist image subsequent to image development effectively upgrades its plasma etch durability.

In conducting the electron beam lithography process, the initial step is preparation of a substrate such as chrome on glass or a silicon or sapphire wafer. After an optional baking step to remove absorbed water vapor and solvents, the substrate blanks are cleaned by blowing with filtered dry air or nitrogen and a film of the resist is applied, preferably by spin coating using for example a slow spin of 1 to 2 seconds to spread the resist over the substrate. The slow spin is followed by a ramp to the final spin speed which may then be held for 30 to 60 seconds. The resists are applied from a solvent. After the resist is applied by the spin coating technique and good topgraphy of the film is achieved, a preferred step is to prebake the resist in order to obtain good adhesion. The prebaking step is carried out at a temperature slightly above the glass transition temperature but below a temperature which could cause cross-linking of the resist.

At this stage the resist coated substrate is exposed to an electron beam current which is consistent with the sensitivity of the resist. Most e-beam equipment has an automated routine for variation of spot current at discrete steps thus minimizing operator involvement. It is important at this stage that the beam of electrons be closely controlled since the polymer undergoes cross-linking or chain scission as a result of the action of high energy electrons on the polymer chain. In general, the resist should be exposed to an electron beam ranging from about 5 to 20 keV.

After exposure to the electron irradiation, the unexposed area of a negative resist is then removed by a developer. The developer should be a combination of a good solvent and non-solvent and should be carefully chosen since too weak a developer does not remove tails and too strong a developer causes swelling and resist damage. The developers include combinations to solvents and non-solvents as are well known in the art. In preferred aspects for practicing this portion of the process, after development, the resist should be rinsed with the solvent to remove any developer solution out of the cross-linked polymer matrix and also mechanically wash away any resist particles remaining around the image. The combination of the development and rinsing steps provide for the delineation of a high resolution approximately one-half micrometer image.

After developing and rinsing, the structure may also be post-baked to improve the resist image by baking out solvents and increase adhesion. The structure is then preferably descummed by application of the plasma etch to remove a slight amount of resist thus improving the etch quality by the removal of tails. Either oxygen or moist air may be used for the light plasma etch.

At this stage of the process the exposed and developed image is then subjected to vapor phase impregnation by an aromatic compound as described above at a temperature ranging from about 100° to 200° C. over a period of about one-half to three hours. As pointed out above the preferred aromatic compounds are anthracene or paradichlorobenzene.

The relief image which is obtained from this series of steps can thereafter be used as a pattern in subsequent etching and deposition steps to provide the desired miniaturized circuits. In these processes either wet or dry etching may be used to etch out the unprotected areas of the wafer. Finally, the resist material is stripped from the wafer before the next level of the device can be defined. A variety of acids, bases and solvents may be used for stripping as known in the art.

The following examples are presented to illustrate the invention but the invention is not to be considered as limited thereto. In the examples and throughout the specification parts are by weight unless otherwise indicated.

EXAMPLE 1

In this example, the substrate was a silicon wafer coated with a negative polymeric resist sold commercially as SEL-N-B by Somar Manufacturing Co. Ltd. of Tokyo, Japan and described in U.S. Pat. No. 4,299,911. The resist was applied at a film thickness of 4,300 Å. The resist coated wafer was then exposed and processed in accordance with standard e-beam technology. Three separate wafers were provided. In two of the wafers, the resist images delineated in the resist were treated for one hour at 150° C. in the presence of anthracene in one case and para-dichlorobenzene vapor in the other case. A control sample was heated to 150° C. in ambient atmosphere for one hour. These three separate wafers were then subjected to moist air plasma etching.

As shown in the drawing accompanying the invention, the untreated resist A was etched by moist air plasma at the rate of 67.8 Å per minute. The 1,4-chlorobenzene treated resist B was etched at the rate of 59 Å per minute or 13 percent better. The anthracene treated resist C was etched at a rate of 51.4 Å per minute which is a 24 percent improvement over the control or untreated resist.

EXAMPLE 2

In this experiment, an additional SEL-N-B resist sample was prepared by dissolving anthracene in the resist liquid prior to coating the substrate. The experimental determination of electron beam sensitivity indicates that the sensitivity and resolution of the resist were not diminished by the addition of anthracene. The test pattern delineated in the resist with and without the aromatic compounds were exposed to moist air and chlorine and $CF_4/O_2$ plasma environments. The untreated resist was etched at a rate of 77 Å per minute in the moist air whereas the resist applied in which anthracene was dissolved was etched at 64.2 Å per minute or 17 percent better.

In contrast to the results obtained with moist air plasma, the plasma durability of the resist in chlorine plasma was unimproved by the addition of the para-dichlorobenzene or anthracene. In the $CF_4/O_2$ plasma, the plasma etch durability of the anthracene treated resist was actually worsened by approximately 12 percent.

In these experiments the plasma durability experiments were conducted on a LFE PRS/PCrE/PDS/501 plasma etcher using the moist air and chlorinated hydrocarbon plasma settings. Moist air plasma experiments were carried out for two minutes at a time at 100 watts and one Torr. The chlorine plasma experiments were conducted at 400 watts and 7 Torr for two minutes with a CRE/100 etch gas flow setting of 20. $CF_4/O_2$ plasma experiments were carried out at 360 watts and 6 Torr. The thickness of the resist images was measured using Nanometrics Nanospec-AFT thick film measuring instrument calibrated with a silicon wafer reference. Thickness readings taken after two minute etch intervals were plotted and fitted to a straight line and slopes to the lines were taken as the etch rate in Å/minute.

The invention has been described herein with reference to certain preferred embodiments. However, as obvious variations thereon will become apparent to those skilled in the art, the invention is not to be considered as limited thereto.

I claim:

1. An article of manufacture comprising a substrate having a polymeric resist thereon, said polymeric resist having been impregnated with a volatile aromatic compound by vapor diffusion, said impregnated resist having improved resistance to plasma etching, wherein the aromatic compound is of the following general formula:

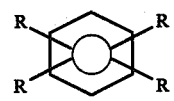

wherein any of the R groups can be hydrogen, halogen, alkyl of 1 to 7 carbons, alkoxy, phenyl, or any two or more of the R groups can be alkylene chains of 3 to 4 carbon atoms to form one or more fused rings on the basic benzene nucleus.

2. An article according to claim 1 wherein the polymeric resist is selected from the group consisting of polystyrene, polymethyl methacrylate, polyglycidyl methacrylate, polychloromethyl (styrene), poly(diallylphthalate), poly(methylvinyl ketone), poly(vinyl acetate), poly(vinyl cinnamate), poly(vinyl chloride), polyvinyl pyrrolidone, poly(glycidyl methacrylate-co-ethyl acrylate), poly(4-chlorostyrene), polyvinyltoluene (mixed isomers), polyvinylbenzylchlorides, poly(4-bromostyrene), poly(4-iso-propylstyrene), poly(4-tert.-butylstyrene), poly(butene-1-sulfone), copolymers of alpha cyano ethyl acrylate and alpha amide ethyl acrylate, poly(glycidyl acrylate), and poly(glycidyl methacrylate-co-3-chlorostyrene).

3. A method for improving the plasma etch durability of a polymeric resist material and images delineated in said resist material, which comprises incorporating an aromatic chemical compound into the resist image by vapor phase diffusion after exposure and development, wherein the aromatic compound is of the following general formula:

wherein any of the R groups can be hydrogen, halogen, alkyl of 1 to 7 carbons, alkoxy, phenyl, or any two or more of the R groups can be alkylene chains of 3 to 4 carbon atoms to form one or more fused rings on the basic benzene nucleus.

4. A method according to claim 3 wherein the polymeric resist is selected from the group consisting of polystyrene, polymethyl methacrylate, polyglycidyl methacrylate, polychloromethyl(styrene), poly(diallylphthalate), poly(methylvinyl ketone), poly(vinylacetate), poly(vinyl cinnamate), poly(vinyl chloride), polyvinyl pyrrolidone, poly(glycidyl methacrylate-co-ethyl acrylate), poly(4-chlorostyrene), polyvinyltoluene (mixed isomers), polyvinylbenzylchlorides, poly(4-bromostyrene), poly(4-iso-propylstyrene), poly(4-tert.-butylstyrene), poly(butene-1-sulfone), copolymers of alpha cyano ethyl acrylate and alpha amide ethyl acrylate, poly(glycidyl acrylate), and poly(glycidyl methacrylate-co-3-chlorostyrene).

5. A method according to claim 3 wherein the polymeric resist is contacted with the vapor of the aromatic compound at a temperature of about 100° C. to 200° C.

6. A method according to claim 3 wherein the aromatic compound is selected from the group consisting of benzene, naphthalene, anthracene, biphenyl and 1,4-dichlorobenzene.

7. A method according to claim 3 for improving the plasma etch durability of a polymeric resist material and images delineated in said resist material wherein the compound incorporated into the resist image by vapor phase diffusion after exposure and development is anthracene or 1,4-dichlorobenzene.

8. A method for forming a predetermined surface relief pattern in a film of resist material, said method comprising the steps of:
   (a) providing a film of a polymeric resist material on a substrate;
   (b) exposing a portion of the film corresponding to said predetermined pattern to radiation which changes the solubility of the exposed portion with respect to the unexposed portion;
   (c) dissolving the more soluble portion of the film with the developer solution to provide a relief pattern; and
   (d) exposing the resist material to the vapor of an aromatic compound which is effective to dissolve into the polymeric resist to improve the plasma etch durability of the resist, wherein the aromatic compound is of the following general formula:

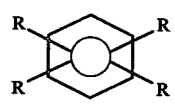

wherein any of the R groups can be hydrogen, halogen, alkyl of 1 to 7 carbons, alkoxy, or any two or more of the R groups can be alkylene chains of 3 to 4 carbon atoms to form one or more fused rings on the basic benzene nucleus.

9. A method according to claim 8 wherein the reaction of the aromatic compound with the polymeric resist is conducted at a temperature of about 100° C. to 200° C. for a time period of about one-half to three hours.

10. A method according to claim 8 wherein the polymeric resist is selected from the group consisting of polystyrene, polymethyl methacrylate, polyglycidyl methacrylate, polychloromethyl (styrene), poly(diallylphthalate), poly(methylvinyl ketone), poly(vinyl acetate), poly(vinyl cinnamate), poly(vinyl chloride), polyvinyl pyrrolidone, poly(glycidyl methacrylate-co-ethyl acrylate), poly(4-chlorostyrene), polyvinyltoluene (mixed isomers), polyvinylbenzylchlorides, poly(4-bromostyrene), poly(4-iso-propylstyrene), poly(4-tert.-butylstyrene), poly(butene-1-sulfone), copolymers of alpha cyano ethyl acrylate and alpha amide ethyl acrylate, poly(glycidyl acrylate), and poly(glycidyl methacrylate-co-3-chlorostyrene).

11. A method according to claim 8 wherein the aromatic compound is selected from the group consisting of benzene, naphthalene, anthracene, biphenyl, and 1,4-dichlorobenzene.

12. A method for forming a predetermined surface relief pattern in a film of a resist material, by electron beam lithography, said method comprising the steps of:
(a) providing a film of polymeric material as a resist material on a substrate;
(b) exposing a portion of the film corresponding to said predetermined pattern to electron beam radiation which changes the solubility of the exposed portion with respect to the unexposed portion;
(c) dissolving the more soluble portion of the film with a developer solution to provide said relief pattern;
(d) exposing the developed resist to the vapor of an aromatic compound which is effective to dissolve into the polymeric resist to improve the plasma etch durability of the resist, wherein the aromatic compound is of the following general formula:

wherein any of the R groups can be hydrogen, halogen, alkyl of 1 to 7 carbons, alkoxy, or any two or more of the R groups can be alkylene chains of 3 to 4 carbon atoms to form one or more fused rings on the basic benzene nucleus; and
(e) subjecting the resist to a plasma etch to etch out the unprotected areas on the substrate.

13. A method according to claim 12 wherein the substrate is silicon or sapphire.

14. A method according to claim 12 wherein the resist is applied in a film forming solvent.

15. A method according to claim 12 wherein the polymeric resist is contacted with the vapor of the aromatic compound at a temperature of about 100° C. to 200° C.

16. A method according to claim 12 wherein the film is exposed to electron beam radiation at a level of approximately 0.1–20 microcoulomb per square centimeter to cross link the polymer.

17. A method according to claim 16 wherein the polymeric resist is selected from the group consisting of polystyrene, polymethyl methacrylate, polyglycidyl methacrylate, polychloromethyl (styrene), poly(diallylphthalate), poly(methylvinyl ketone), poly(vinyl acetate), poly(vinyl cinnamate), poly(vinyl chloride), polyvinyl pyrrolidone, poly(glycidyl methacrylate-co-ethyl acrylate), poly(4-chlorostyrene), polyvinyltoluene (mixed isomers), polyvinylbenzylchlorides, poly(4-bromostyrene), poly(4-iso-propylstyrene), poly(4-tert.-butylstyrene), poly(butene-1-sulfone), copolymers of alpha cyano ethyl acrylate and alpha amide ethyl acrylate, poly(glycidyl acrylate), and poly(glycidyl methacrylate-co-3-chlorostyrene).

18. A method according to claim 17 wherein the aromatic compound is selected from the group consisting of benzene, naphthalene, anthracene, biphenyl and 1,4-dichlorobenzene.

19. An article of manufacture comprising a substrate having a polymeric resist thereon, said polymeric resist having been impregnated with a volatile aromatic compound by vapor diffusion, said impregnated resist having improved resistance to plasma etching.

* * * * *